(12) United States Patent
Hui

(10) Patent No.: US 7,180,102 B2
(45) Date of Patent: Feb. 20, 2007

(54) METHOD AND APPARATUS FOR USING COBALT SILICIDED POLYCRYSTALLINE SILICON FOR A ONE TIME PROGRAMMABLE NON-VOLATILE SEMICONDUCTOR MEMORY

(75) Inventor: Frank Yauchee Hui, Orlando, FL (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 10/675,555

(22) Filed: Sep. 30, 2003

(65) Prior Publication Data
US 2005/0067670 A1 Mar. 31, 2005

(51) Int. Cl.
*H01L 29/51* (2006.01)
(52) U.S. Cl. ............... 257/153; 257/528; 257/529; 438/132; 438/215
(58) Field of Classification Search ............... 257/529, 257/528, 153; 438/132, 215, 601, 281
See application file for complete search history.

(56) References Cited

U.S. PATENT DOCUMENTS

| | | |
|---|---|---|
| 4,042,950 A | 8/1977 | Price |
| 4,356,622 A | 11/1982 | Widmann |
| 4,748,491 A | 5/1988 | Takagi |
| 5,386,158 A | 1/1995 | Wang |
| 5,536,968 A | 7/1996 | Crafts et al. |
| 5,854,510 A | 12/1998 | Sur, Jr. et al. |
| 5,882,998 A | 3/1999 | Sur, Jr. et al. |
| 5,949,712 A | 9/1999 | Rao et al. |
| 5,976,943 A | 11/1999 | Manley et al. |
| 6,205,077 B1 | 3/2001 | Ferrant |
| 6,243,294 B1 | 6/2001 | Rao et al. |
| 6,337,507 B1 | 1/2002 | Bohr et al. |
| 6,433,404 B1 * | 8/2002 | Iyer et al. .................. 257/529 |
| 6,445,606 B1 | 9/2002 | Khoury |
| 6,507,053 B1 | 1/2003 | Bernard et al. |
| 6,511,868 B2 | 1/2003 | Wang et al. |
| 6,518,823 B1 | 2/2003 | Kawai |
| 6,525,955 B1 | 2/2003 | Smith et al. |
| 6,703,263 B2 * | 3/2004 | Wang et al. .................. 438/132 |

OTHER PUBLICATIONS

S. R. Wilson, C. J. Tracy, and J. L. Freeman, Jr., "Handbook of Multilevel Metallization for Integrated Circuits," Noyes Publ., Westwood, N.J. (1993), pp. 44, 55.*

* cited by examiner

*Primary Examiner*—Douglas W. Owens

(57) ABSTRACT

A fusible link formed on a semiconductor substrate. The fusible link comprises a silicide layer overlying a polysilicon layer. The fusible link is programmed to an open state by passing a current therethrough that opens the polysilicon and the silicide layers.

21 Claims, 4 Drawing Sheets

METHOD AND APPARATUS FOR USING COBALT SILICIDED POLYCRYSTALLINE SILICON FOR A ONE TIME PROGRAMMABLE NON-VOLATILE SEMICONDUCTOR MEMORY

FIELD OF THE INVENTION

This invention relates generally to semiconductor integrated circuit fabrication technologies and more specifically to a one-time programmable non-volatile memory.

BACKGROUND OF THE INVENTION

Memory devices for storing digital data are abundant in today's computers, automobiles, cellular telephones and media information cards. Certain of these memory devices or storage elements, referred to as non-volatile memory, retain the stored digital data when power is removed from the device. For example non-volatile memory instructions instruct a computer during the boot-up process and store instructions and data for sending and receiving calls in a cellular telephone. Electronic products of all types, from microwave ovens to heavy industrial machinery, store their operating instructions in non-volatile storage elements. Certain non-volatile memory devices offer multiple programming capabilities, with previously stored information overwritten by new data. Other non-volatile devices provide only one-time programmability.

Volatile memory devices, another class of memory devices, loose the stored information when power is removed. Dynamic random access memories (DRAM) and static random access memories (SRAM) are two types of volatile storage elements.

A read-only memory (ROM) is one type of permanent data storage non-volatile memory. Once stored in the ROM device, the data cannot be overwritten or otherwise altered. The ROM is "programmed" during manufacture by making permanent electrical connections in selected memory cells. The stored information can be changed only by redesigning the ROM.

A programmable read-only memory (PROM) is a non-volatile device that can be programmed only once, either during fabrication or thereafter. In one PROM embodiment each memory cell comprises a fusible link The PROM is "programmed" by opening or blowing a fusible link in selected cells, while other links remain intact. Advantageously, manufacturers can offer a single PROM hardware design that can be programmed by the purchaser.

An erasable programmable read-only memory (EPROM), another non-volatile memory device, can be erased and reprogrammed as desired. The EPROM is programmed electronically and erased by passing ultraviolet light through an ultraviolet-permeable quartz window formed in the package. An EEPROM (electronically erasable programmable read-only memory) can be programmed, electronically erased and reprogrammed.

A flash EEPROM memory is a type of EEPROM non-volatile memory that is especially prevalent in electronic devices where the user desires to add or change information after the memory device has been fabricated and inserted into the electronic device. For example, flash memory allows the user to add addresses and calendar entries in a personal digital assistant and erase and re-use media cards that store pictures taken with a digital camera. Flash memory devices differ form other EEPROM devices in that a flash memory permits block of stored data words to be simultaneously erased, whereas other EEPROM devices permit the erasure of only single words. Erasing a memory block in a non-flash EEPROM is a much slower process than the same operation in a flash memory. Also, a flash EEPROM is typically smaller than other types of EEPROM memory devices. A flash memory stores data bits in a floating polysilicon gate and a tunnel oxide immediately below the control gate/gate oxide stack of the conventional MOSFET.

An anti-fuse device is yet another PROM non-volatile memory. Unlike the PROM device where the fusible links are formed in a closed state, the anti-fuse is formed in an opened state and programmed to a closed state using a voltage that is higher than the normal operating supply voltage for the integrated circuit on which the anti-fuse is formed. Transistors in the anti-fuse programming circuitry must be fabricated with higher junction breakdown voltages than the conventional transistor. But higher doping levels in advanced integrated circuit devices result in lower junction breakdown voltages, rendering anti-fuse devices less compatible with these advanced circuits. Also, certain of the anti-fuse materials are not compatible with standard CMOS fabrication processes.

Certain non-volatile memory devices are referred to as "one-time programmable (OTP)," memories, including anti-fuse devices, EPROM's and PROM's. OTP memory can be further subdivided into those with relatively large arrays of storage elements (or cells) and those with a relatively small number of cells. OTP devices with few cells are useful for trimming analog device parameters (e. g., fusible links are disposed to short out or add individual resistors) and for permanently storing a relatively small number of non-modifiable data bits. For example, an integrated circuit chip can be identified by unique data bits stored in an on-chip OTP device. The identification information can be used to track the chip during service and associate the chip with a wafer from which it was singulated.

Such OTP non-volatile memory devices can comprise conductive fuses or fusible links disposed in a conductive interconnect structure of the integrated circuit chip. Depending upon the process technology selected, a material of the conductive layer comprises polysilicon, metal or a silicide material. The OTP devices can be formed on a top layer or lower layers of the interconnect structure. Generally, the fusible link is formed coincident with the formation of the interconnect structure by adding fusible link features to the interconnect structure mask, followed by patterning and etching steps to form the interconnect structure and the conductive fusible links.

To program (i.e., open) the fusible links according to one technique, the integrated circuit is masked to expose the fusible links to be opened. Laser energy directed at the exposed fusible links opens therin. The resulting combination of opened and closed fusible links represents information, such as a chip identification code, that can be retrieved by reading the pattern of opened and closed links.

A "few times programmable" (FTP) memory device comprises a capacitor disposed above and connected in series with the gate of a metal-oxide field effect transistor (MOSFET). Charge stored on the capacitor turns the MOSFET on. A MOSFET without stored charged on the series capacitor remains off. Thus a stored one or zero bit is determined from the state of the MOSFET. The structure is designed to retain the charge for years, although such devices can be reprogrammed.

Disadvantageously, according to the prior art, the formation of fusible links in an integrated circuit device requires the creation of process masks and the execution of additional process steps. Each mask step adds cost to the fabrication process and increases the probability of a circuit defect. Also, the fusible links consume chip area that could otherwise be devoted to active devices.

BRIEF SUMMARY OF THE INVENTION

The invention comprises a fusible link device disposed on a semiconductor substrate comprising a first material layer having a first sheet resistance and a second material layer having a second sheet resistance overlying the first material layer. The second sheet resistance is less than the first sheet resistance. The fusible link is programmable to an opened state in which an opening is formed in the first and the second material layers. In a closed state the first and the second material layers provide a current path therethrough.

The invention further comprises a method for forming a fusible link in a semiconductor integrated circuit comprising providing a substrate, forming a first material layer overlying the substrate, wherein the first material layer has a first sheet resistance. A fusible link region is formed from the first material layer. A second material layer is formed overlying the first material layer of the fusible link region, wherein the second material layer has a second sheet resistance. The second sheet resistance is less than the first sheet resistance. An opening is formed in the first and the second material layers to program the fusible link to an opened state.

BRIEF DESCRIPTION OF THE DRAWINGS

The foregoing and other features of the invention will be apparent from the following more particular description of the invention, as illustrated in the accompanying drawings, in which like reference characters refer to the same parts throughout the different figures. The drawings are not necessarily to scale, emphasis instead being placed upon illustrating the principles of the invention.

DETAILED DESCRIPTION OF THE INVENTION

Figure 1:
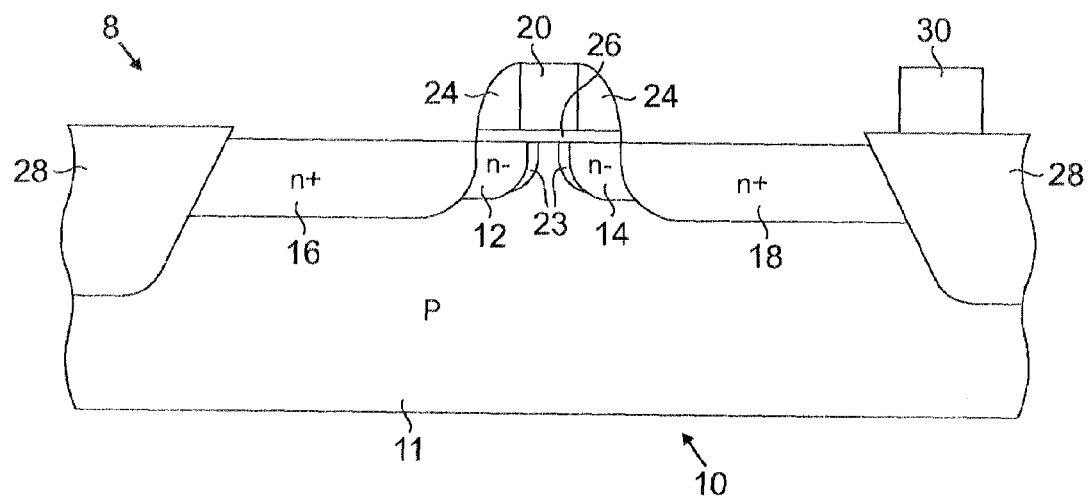
FIGS. 1 is a cross-sectional view of an integrated circuit region, including a fusible link constructed according to the teachings of the present invention.

Before describing in detail the particular method and apparatus for forming a one-time programmable non-volatile memory element on a semiconductor chip, it should be observed that the present invention resides primarily in a novel and non-obvious combination of elements and process steps. Accordingly, the inventive elements and steps have been represented by conventional elements and steps in the drawings, showing only those specific details that are pertinent to the present invention so as not to obscure the disclosure with details that will be readily apparent to those skilled in the art having the benefit of the description herein.

After forming the doped regions in a semiconductor substrate, the regions must be connected to form operative devices that perform the desired circuit functions. These connections, referred to as conductive interconnects or metallization structures, are formed using known photolithographic and deposition techniques, and comprise substantially horizontal conductive traces interconnecting substantially vertical conductive vias. The effectiveness of the overall conductive interconnect system is governed by the resistivity, thickness, length and the total contact resistance of all the conductive interconnects. The contact resistance at each conductive material-to-doped region interface is influenced by the conductive material employed, the substrate doping density and the contact dimensions. The smaller the contact size, the higher the contact resistance. In modem semiconductor circuits the contact resistance is the dominant factor in the metal interconnect system performance.

One technique for forming a low contact resistance interface between the doped region and the conductive interconnect structure employs a silicide layer interposed between the interconnect structure and the device doped region, such as the source/drain regions and polysilicon gate of a metal-oxide-semiconductor field effect transistor (MOSFET). The practice of using the silicide layer has become increasingly important for very high-density devices where the feature size, and thus the contact area, is reduced to a fraction of a micrometer. A silicide layer can provide good ohmic contact, reduces the sheet resistivity and the contact resistance of source/drain regions and polysilicon gates, increases the effective contact area, and provides an etch stop layer during subsequent processing steps.

Silicide processing involves the deposition of a metal that forms intermetallic bonds with the silicon (Si) of the doped regions, but does not react with silicon dioxide or silicon nitride overlying other regions of the integrated circuit. Common metals employed to form the silicide region comprise titanium (Ti), cobalt (Co), tungsten (W), molybdenum (Mo) and nickel (Ni). Generally, the metals employed are refractory metals, as these metals form low resistivity phases with silicon, such as $TiSi_2$, $CoSi_2$ and $NiSi$.

To form the silicide region, the metal is first deposited with a uniform thickness across the entire semiconductor wafer, by for example, using a physical vapor deposition (PVD) from an ultra-pure sputtering target and a commercially available ultra-high vacuum multi-chamber, direct current magnetron sputtering system. For a MOSFET, the deposition is performed after formation of the gate and the source/drain regions. The deposited metal blankets the polysilicon gate electrode, the oxide spacers between the gate and the source/drain regions, and the silicon dioxide isolation regions between devices. A cross-section of an exemplary semiconductor wafer during one stage of a salicide formation process in accordance with the prior art techniques is depicted in FIG. 1.

As shown in FIG. 1, an n-type MOSFET 8 (an element of an integrated circuit) is formed, according to known techniques, within a silicon substrate 10, comprising a p-type well 11, lightly doped (n−) source/drain regions 12/14, source/drain regions (n+) 16/18, and a doped polysilicon gate electrode 20 (with an exemplary doping of 4.4E15 impurities/cubic centimeter) formed over a gate oxide 22. In one embodiment the polysilicon gate is doped n+. A halo implant 23 of relatively high doping concentration is formed adjacent the lightly doped source/drain regions 12/14. Silicon dioxide or silicon nitride spacers 24 are formed laterally adjacent the polysilicon gate electrode 20. Silicon dioxide isolation regions 28 (for example, regions formed from the local oxidation of silicon (LOCOS regions) or silicon dioxide filled shallow trenches (STI regions) are formed laterally adjacent the source/drain regions 16/18 to isolate the MOSFET 8 from adjacent devices. The substrate 10 may further include various additional layers comprising active and passive regions, conductive layers and dielectric layers, none of which are shown in FIG. 1.

According to the teachings of the present invention, one or more fusible links, such as for an OTP memory device, are formed concurrent with formation of the polysilicon gate 20. After the polysilicon layer is deposited, known masking, patterning and etching steps are employed to form the polysilicon gate 20 and a fusible link 30. Advantageously, a single mask can be used to form both the polysilicon gate 20 and the fusible link 30. In one embodiment the fusible link 30 is illustrated as formed over the isolation region 28. Since they are formed from the same material layer, the thickness of the fusible link 30 is substantially identical to the thickness of the polysilicon gate 20.

Figure 2:
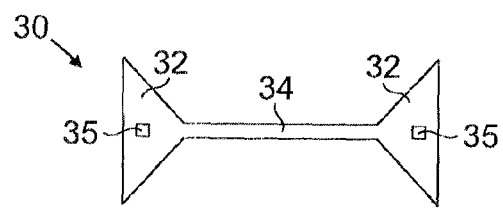
FIG. 2 is a top view of an exemplary fusible link constructed according to the teachings of the present invention.

An exemplary fusible link shape, as formed during the masking, patterning and etchings steps for forming the polysilicon gate 20, is illustrated in the plan view of FIG. 2. The fusible link 30 comprises two substantially triangular regions 32 and a connecting bridge 34. The fusible link 30 is programmed (i.e., retained in the closed state or opened) and the state thereof is sensed by passing current through contacts 35 disposed preferably in the regions 32. The current for programming and sensing is supplied from on-chip or off-chip devices to be described below. The shape illustrated in FIG. 2 tends to increase the current density and thus the heating effect in the connecting bridge 34 during the process of programming the fuse to an open state. The higher current density increases the reliability of correctly programming (i.e., opening) the fusible link 30. Other shapes are also suitable according to the teachings of the present invention. The contacts 35 can be connected to vertical conductive vias or to horizontal conductive traces (neither illustrated in FIG. 2) for programming and sensing access to the fusible link 30 after fabrication of the additional layers of the integrated circuit is complete. In one embodiment the connecting bridge 34 is about 0.15 microns wide by about 0.75 microns long.

Figure 3:
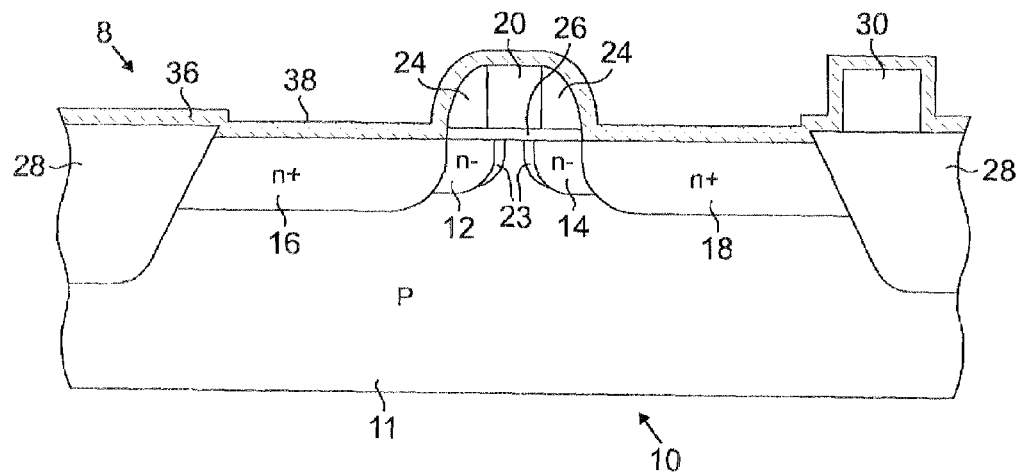
FIGS. 3–5 are cross-sectional views of an integrated circuit region, including a fusible link constructed according to the present invention during consecutive process steps.

As illustrated in FIG. 3, a refractory metal layer 36, comprising cobalt, for example, is blanket deposited over the source/drain regions 16/18, the polysilicon gate 20, the spacers 24, the silicon dioxide isolation regions 28 and the fusible link 30.

Figure 4:
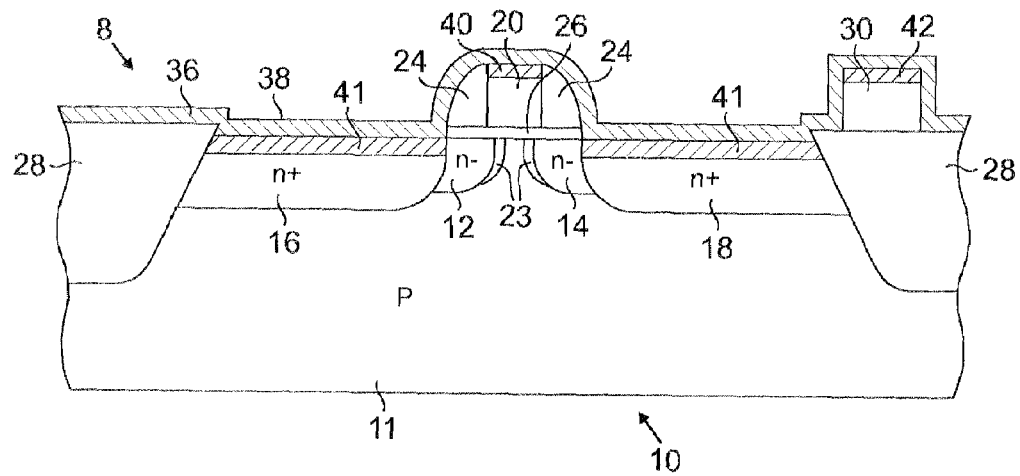

The substrate 10 undergoes a relatively short duration first rapid thermal anneal (RTA) at a temperature of between about 450° to 700° C. in a nitrogen atmosphere. The nitrogen reacts with the metal to form a metal nitride at a top surface 38 of the metal layer 36, while the metal reacts with the underlying silicon, forming a metal silicide. The metal silicide includes a silicide layer 40 within the gate polysilicon 20, silicide layers 41 within the source/drain regions 16/18, and a silicide layer 42 within the fusible link 30. See FIG. 4. Thus the fusible link 30 now comprises a silicide layer 42 and a polysilicon layer 43 (comprising an unreacted region in which no silicide was formed). Typically, about one-third of the underlying polysilicon is consumed during the formation of the metal silicide. At this point in the process the metal silicide exhibits a relatively high resistance.

Figure 5:
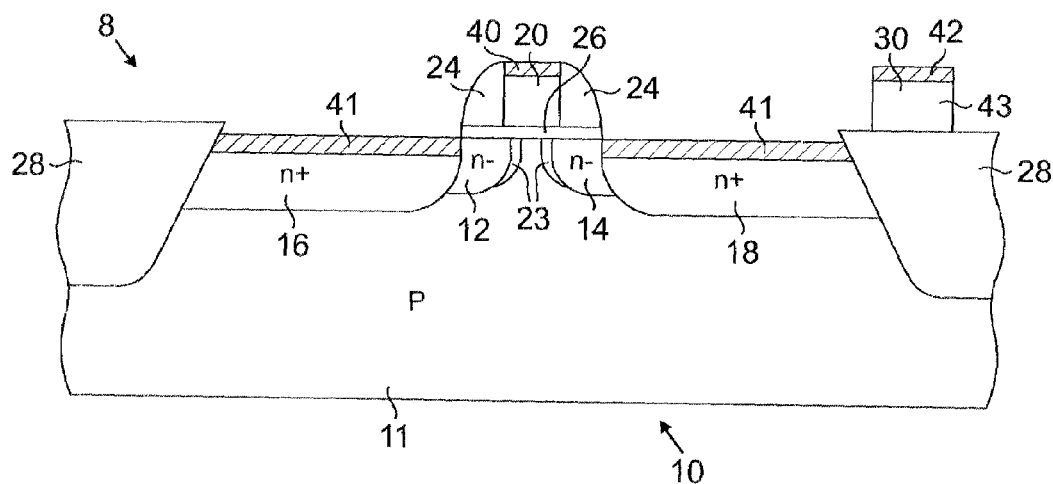

After the first rapid thermal anneal step, any unreacted metal is stripped away by a wet etch process that is selective to the metal silicide. The resultant structure is illustrated in FIG. 5. The substrate 10 is subjected to a second, higher temperature rapid thermal anneal step, for example above 700° C., to change the stochiometry of the metal silicide, forming a lower resistance metal silicide by conversion of the higher resistivity metal silicide to a lower resistivity phase. For example, when the metal is cobalt, the higher resistivity phase is $Co_2Si$ and the lowest resistivity phase is $CoSi_2$. The silicide layer 42 exhibits a much lower sheet resistance than the polysilicon layer 43.

Figure 6:
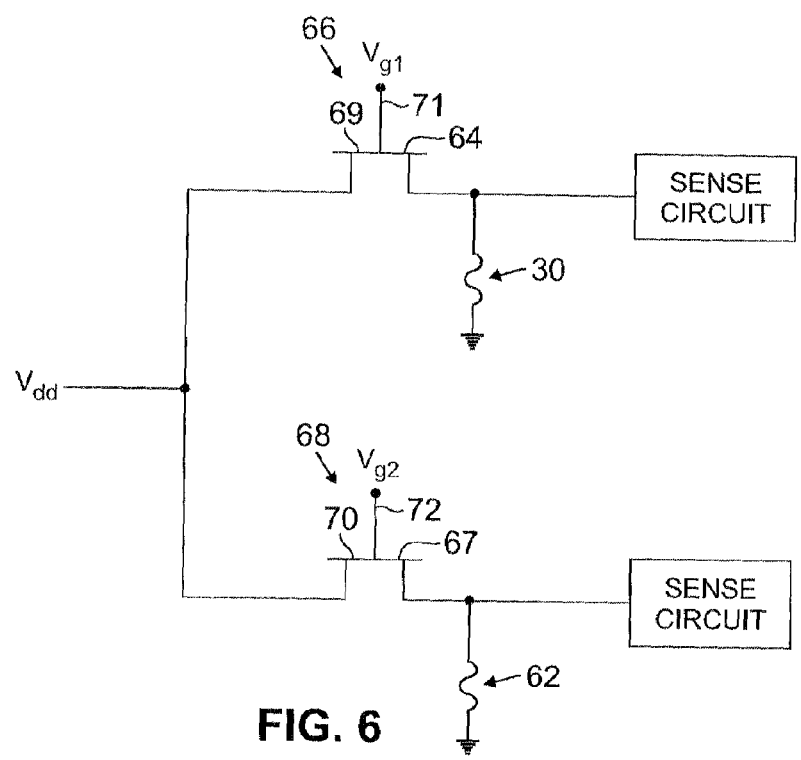
FIG. 6 is a schematic diagram of circuit elements for programming a fusible link constructed according to the teachings of the present invention.

FIG. 6 illustrates a circuit for opening or programming one or both of the fusible links 30 and 62 constructed according to the teachings of the present invention. The fusible link 62 is formed over, for example, the isolation region 28 of FIG. 1. The fusible link 30 is connected between a source/drain 64 of a MOSFET 66 and ground. The fusible link 62 is connected between a source/drain 67 of a MOSFET 68 and ground. A second source/drain 69 and 70 of the MOSFETs 66 and 68, respectively, are connected to a voltage source Vdd.

To open the fusible link 30, a voltage Vg1 is applied to a gate 71 of the MOSFET 66, turning on the MOSFET 66 and permitting current flow from the voltage source Vdd through the source/drain 69, the MOSFET channel (not enumerated by a reference character in FIG. 6) and the source/drain 64 through the fusible link 30, opening the silicide layer 42 and the polysilicon layer 43. The lower resistance silicide layer 42 draws more current than the polysilicon layer 43. This current generates considerable heat that opens the silicide layer 42. The heat also flows into the polysilicon layer 43, causing it to ablate or blow open. Opening the fusible link 30 by opening both the silicide layer 42 and the polysilicon layer 43, according to the teachings of the present invention, provides a higher ratio of closed resistance to opened resistance than if only one of the silicide layer 42 and the polysilicon layer 43 was opened. For example, the fusible link 30 exhibits an open resistance of about 1E6 ohms. Prior art fusible links have an open resistance of about 1000 ohms. Additionally, certain prior art fuses comprising a silicide material, when opened by an ablation process may reform to a closed by regrowth. With both the opened silicide layer 42 and the opened polysilicon layer 43, reformation to a closed state is unlikely for the fusible link 30.

Typically, a current of about 25 mA at a voltage of about 3.3 volts is sufficient to open both the silicide layer 42 and the polysilicon layer 43. The current can be supplied from on-chip or off-chip devices in a pulse of about five milliseconds duration.

The fusible link 62 is opened in a similar manner, through the MOSFET 68 by the application of a turn-on voltage to a gate 72 of the MOSFET 68.

In the closed link state, both the silicide layer 42 and the polysilicon layer 43 remain intact.

Figure 7:
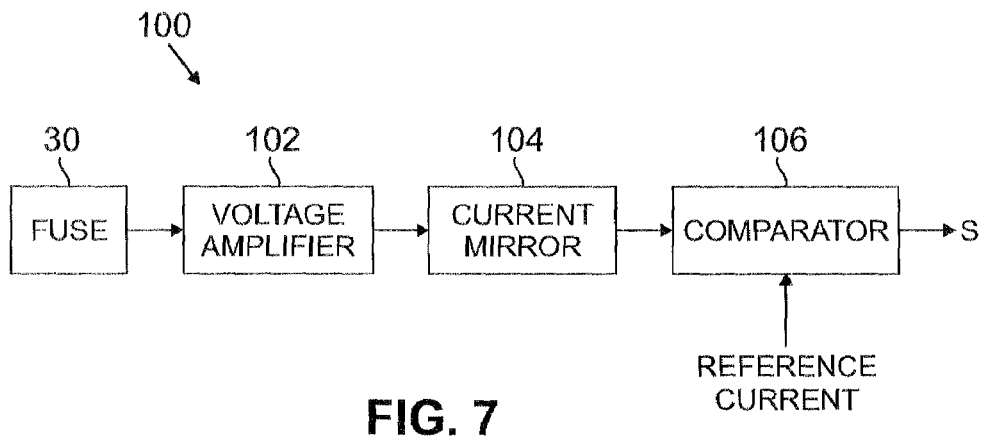
FIG. 7 is a block diagram of a circuit for sensing a fusible link state.

An exemplary sensing circuit 100 for use with a polysilicon silicided fusible link constructed according to the teachings of the present invention is illustrated in FIG. 7. A voltage amplifier connected to the fusible link 30 produces a voltage representative of the state of the fusible link 30. The voltage is supplied to a current mirror 104 for producing a first current therein. A second current, representative of the first current, is also produced by the current mirror 104 and input to a comparator 106. The comparator 106 also receives a reference current for determining the difference between the reference current and the second current and thus the state of the fusible link 30, indicated by an output signal S from the comparator 106. Those skilled in the art recognize that other sensing circuits can be utilized in conjunction with the fusible links of the present invention. Given the higher open resistance of the fusible links of the present invention, as compared with the prior art open fusible links, a less sensitive sensing circuit can be employed with the present invention to read the link state.

Figure 8:
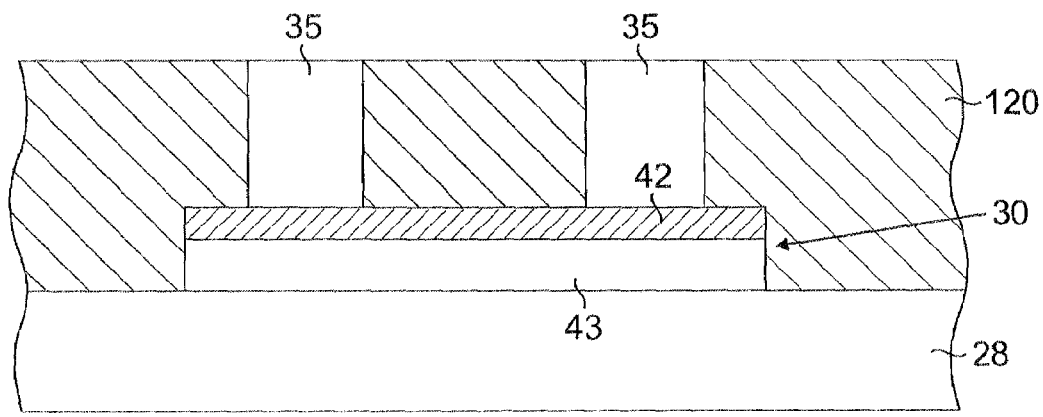
FIG. 8 is a side view of a fusible link according to the teachings of the present invention.

FIG. 8 is a side view of the fusible link 30, illustrating the silicide layer 42 and the polysilicon layer 43 and the contacts 35 formed in an intermetallic dielectric layer 120.

Although the fusible link 30 has been described as formed within the polysilicon layer that also forms the polysilicon gate 20, thus avoiding the requirement for another mask layer, formation concurrent with the gate 20 is not necessarily required for the present invention. Although likely requiring another mask layer, the fusible link 30 can be formed in upper polysilicon layers of the integrated circuit.

A process has been described related to the formation of a fusible link in a silicide region formed in a polysilicon layer and a structure so formed. While specific applications and examples of the invention have been illustrated and discussed, the principles disclosed herein provide a basis for practicing the invention in a variety of ways in any variety of structures. Numerous variations are possible within the scope of the invention. The invention is limited only by the claims that follow.

What is claimed is:

1. A fusible link device disposed on a semiconductor substrate, comprising:
    a first substantially linear material layer having a first sheet resistance and defining first and second terminals at opposing ends thereof, the terminals having a triangular shape;
    a second material layer coextensive with and overlying the first material layer throughout a length bounded by the first and the second terminals, the second material layer having second sheet resistance less than the first sheet resistance;
    wherein the fusible link is programmable to an opened state in which an opening is formed in the first and the second material layers; and
    wherein in a closed state the first and the second material layers provide a current path therethrough.

2. The fusible ink of claim 1 wherein a material of the first material layer comprises doped polysilicon.

3. The fusible link of claim 1 wherein a material of the second material layer comprises a metal silicide.

4. The fusible link of claim 1 wherein a material of the second material layer is selected from among cobalt silicide, titanium silicide, tungsten silicide, molybdenum silicide and nickel silicide.

5. The fusible link of claim 1 operative with a current source for controllably passing a current between the first and the second through the first material layer and the second material layer for creating the openings therein.

6. The fusible link of claim 5 wherein the current is about 25 mA at about 3.3 V.

7. The fusible link of claim 5 wherein the current source comprises a voltage source and a controllable switch connected in series thereto, wherein the switch is operative to a closed state in which current is supplied to the fusible link.

8. The fusible link of claim 1 wherein a data bit is represented by the opened state and the closed state.

9. A semiconductor integrated circuit comprising:
    a substrate;
    doped regions within the substrate, wherein the doped regions form active devices;
    a fuse structure comprising:
        a first substantially linear material layer having a first sheet resistance having first and second terminals at opposing ends thereof, the terminals having a triangular shape;
        a second material layer coextensive with and overlying the first material layer, the second material layer having a second sheet resistance less than the first sheet resistance;
    wherein the fuse structure is programmable to an opened state in which an opening is formed in the first and the second material layers; and
    wherein in a closed state the first and the second material layers are intact.

10. The semiconductor integrated circuit of claim 9 further comprising a MOSFET active device formed from doped regions within the substrate, wherein the MOSFET further comprises a gate, and wherein a material of the gate comprises the first material layer.

11. The semiconductor device of claim 9 further comprising isolation regions disposed between certain active devices, wherein the fuse structure is disposed over an isolation region.

12. The semiconductor device of claim 11 wherein a material of the isolation region comprises silicon dioxide.

13. A method for forming a fusible link in a semiconductor integrated circuit, comprising:
    providing a substrate;
    forming a first material layer overlying the substrate, wherein the first material layer has a first sheet resistance;
    forming, from the first material layer, a fusible link region and triangularly shaped terminal regions at spaced apart ends of the fusible link region;
    forming a second material layer overlying the first material layer of the fusible link region, wherein the second material layer is disposed over the first material layer along a length of the fusible link region and the first and the second terminal regions, and wherein the second material layer has a second sheet resistance, and wherein the second sheet resistance is less than the first sheet resistance; and
    causing current to flow through the second material layer, wherein the current produces heat for opening the first and the second material layers to program the fusible link to an opened state.

14. The method of claim 13 wherein the step of forming the first material layer comprises forming a doped polysilicon layer.

15. The method of claim 13 wherein the step of forming the second material layer comprises forming a metal silicide layer.

16. The method of claim 13 wherein a material of the second material layer is selected from among cobalt silicide, titanium silicide, tungsten silicide, molybdenum silicide and nickel silicide.

17. The method of claim 13 wherein the step of forming an opening further comprises passing a current through the first material layer and the second material layer for creating the openings therein.

18. The method of claim 17 wherein the current is about 25 mA at about 3.3 V.

19. The method of claim 13 wherein the opening represents a data bit.

20. The method of claim 13 wherein the semiconductor integrated circuit further comprises active devices, and wherein certain of the active devices comprise a gate, and wherein the step of forming the fusible link region further comprises forming a gate and fusible link region from the first material layer.

21. The method of claim 13 wherein the semiconductor integrated circuit further comprises active devices, and wherein certain of the active devices are separated by isolation regions, and wherein the step of forming a fusible link region further comprises forming the fusible link region overlying an isolation region.

* * * * *